United States Patent [19]

Freeman

[11] Patent Number: 4,670,749

[45] Date of Patent: Jun. 2, 1987

[54] INTEGRATED CIRCUIT PROGRAMMABLE CROSS-POINT CONNECTION TECHNIQUE

[75] Inventor: Ross H. Freeman, San Jose, Calif.

[73] Assignee: Zilog, Inc., Campbell, Calif.

[21] Appl. No.: 599,931

[22] Filed: Apr. 13, 1984

[51] Int. Cl.⁴ ............................................. H04Q 1/00
[52] U.S. Cl. ......................... 340/825.85; 340/825.86; 340/825.9; 340/825.93; 307/465
[58] Field of Search ........... 340/825.79, 825.8, 825.83, 340/825.85, 825.9, 825.91, 825.93, 825.86; 307/248, 465–469, 571, 475; 179/18 GF, 18 H

[56] References Cited

U.S. PATENT DOCUMENTS

| | | | |
|---|---|---|---|
| 3,852,723 | 12/1974 | Wu | 340/825.83 |
| 4,024,352 | 5/1977 | Mukaemachi et al. | 179/18 GF |
| 4,068,215 | 1/1978 | Mukaemachi et al. | 179/18 GF |
| 4,331,956 | 5/1982 | Anderson | 179/18 GF |

OTHER PUBLICATIONS

Horrell, J. L., "A Programmable Switching System in an Asynchronous Digital Node", National Telemetering Conference, Washington, DC, Apr. 1971, pp. 283–288.

*Interface Integrated Circuits:* National Data Book, Apr. 1984, pp. 8–10; 8–31.

*MM54HC/74HC High Speed Micro MOS Logic Family Data Book,* National Data Book, 1983, pp. 4–387.

*Primary Examiner*—Ulysses Weldon
*Attorney, Agent, or Firm*—Majestic, Gallagher, Parsons & Siebert

[57] ABSTRACT

A technique for programming connections of conductors that is particularly adapted to be implemented as part of an integrated circuit so that a number of connections internal of the circuit can be made from outside the circuit in order to customize it after fabrication. A specific arrangement of five switching transistors is particularly advantageous for each cross-point of two conductors to be connected together in one of many possible ways. The desired switching arrangement at each cross-point may be programmed by use of the same conductors being interconnected to carry control signals from outside the circuit to a memory associated with each cross-point switching circuit. While these memories are being programmed, each cross-point is temporarily forced to a desired state for communicating the control signals from outside the circuit to the memories.

3 Claims, 5 Drawing Figures

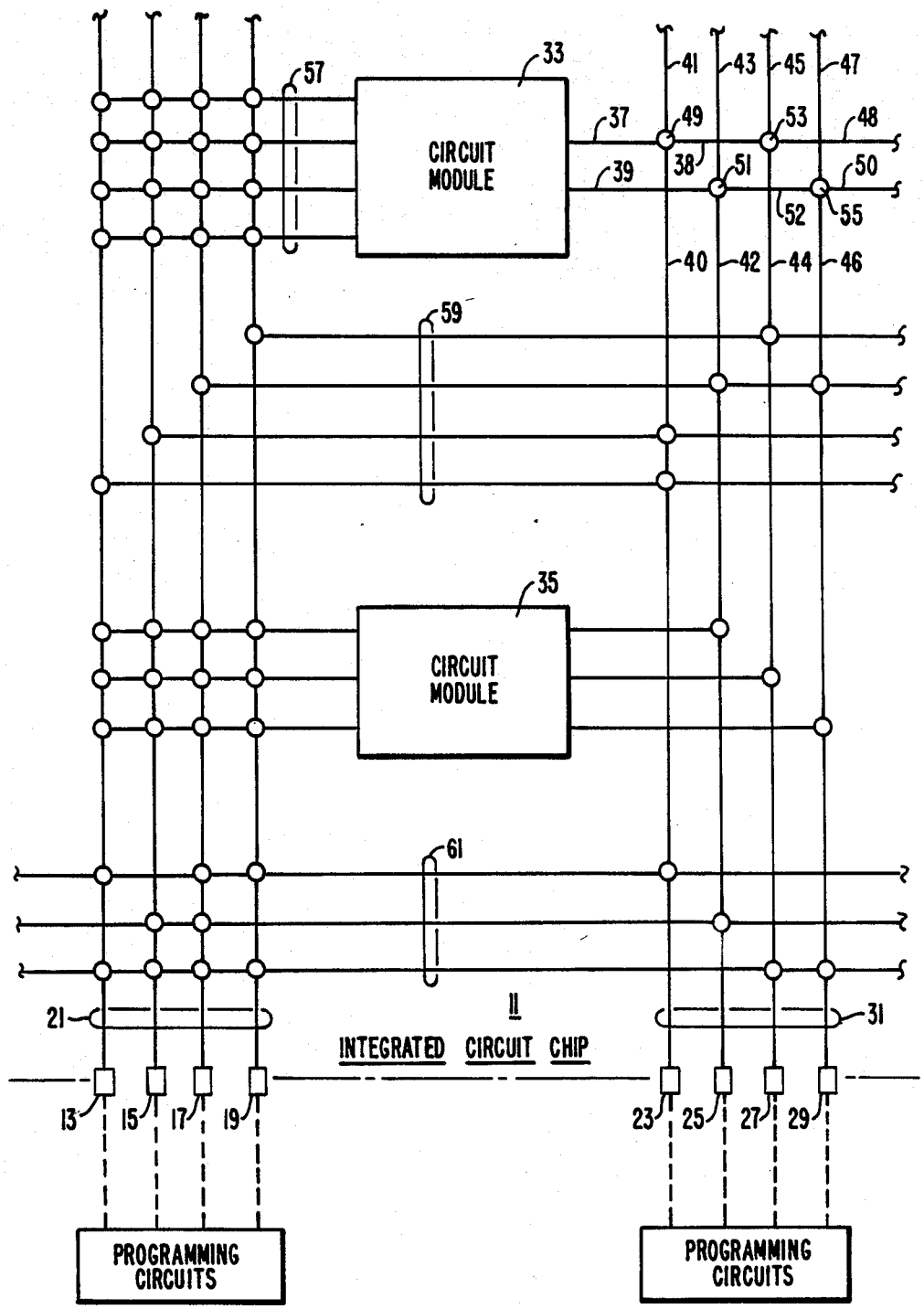
FIG._1.

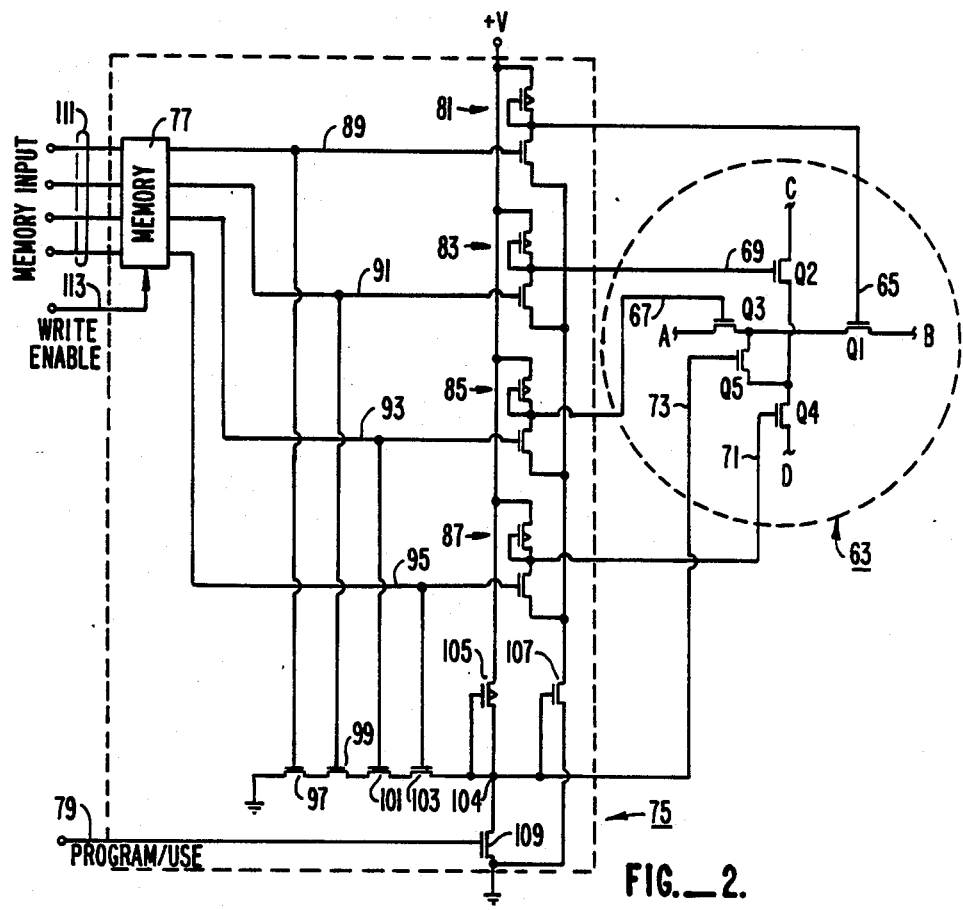
FIG._2.
| Q1 | Q2 | Q3 | Q4 | CIRCUIT |
|---|---|---|---|---|
| -- | (SEE TEXT) | -- | -- | A─C/D─B |
| 0 | 0 | 1 | 1 | A─┐C/D |
| 0 | 1 | 0 | 1 | A─┐ ┌C/D |
| 0 | 1 | 1 | 0 | A─C/ ┌C/D |
| 0 | 1 | 1 | 1 | A─┐C/D |
| 1 | 0 | 0 | 1 | ┌B/D |
| 1 | 0 | 1 | 0 | A───B |
| 1 | 0 | 1 | 1 | A───B/D |
| 1 | 1 | 0 | 0 | C/D |
| 1 | 1 | 0 | 1 | C─B/D |
| 1 | 1 | 1 | 0 | A─C─B |
| 1 | 1 | 1 | 1 | A─C/D─B |
FIG._3.

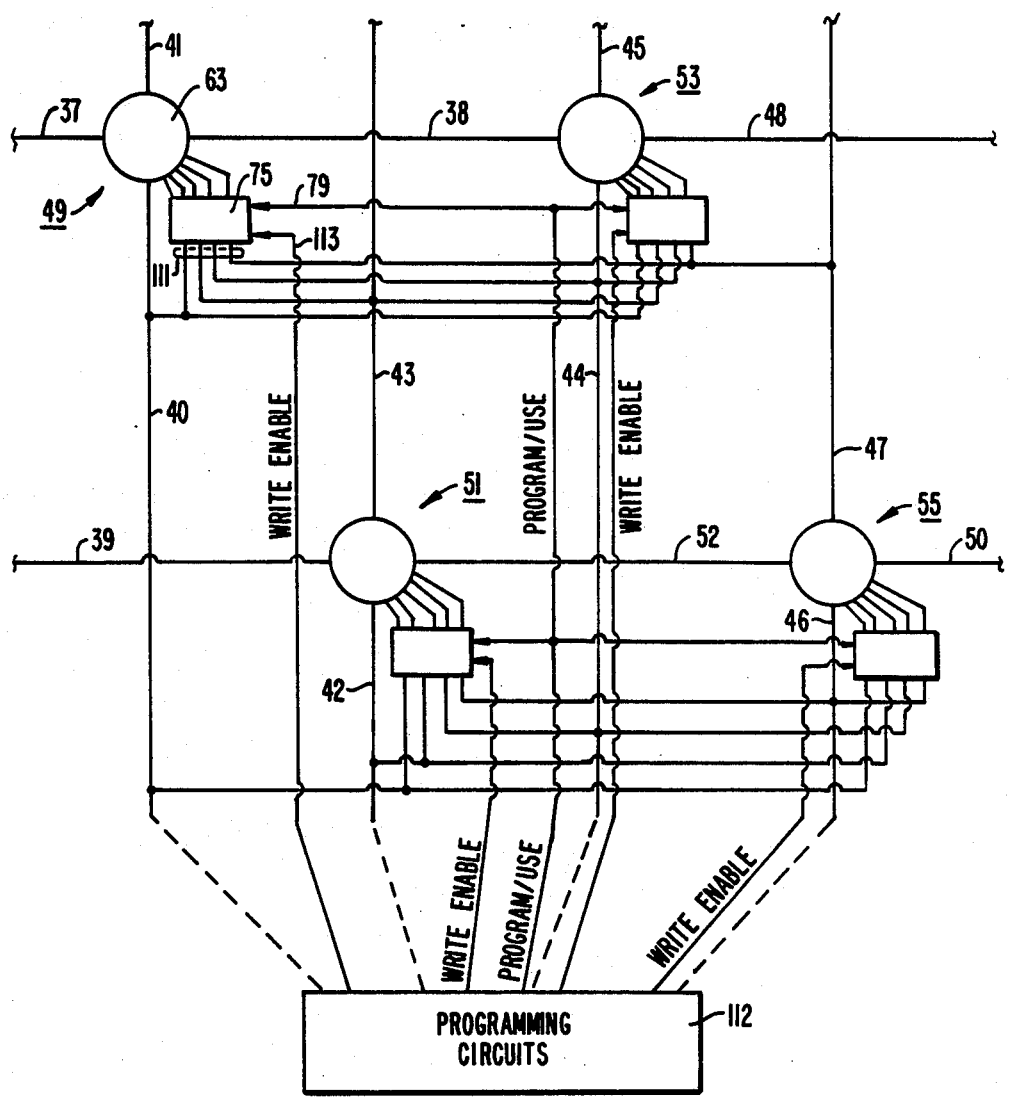
FIG._4.

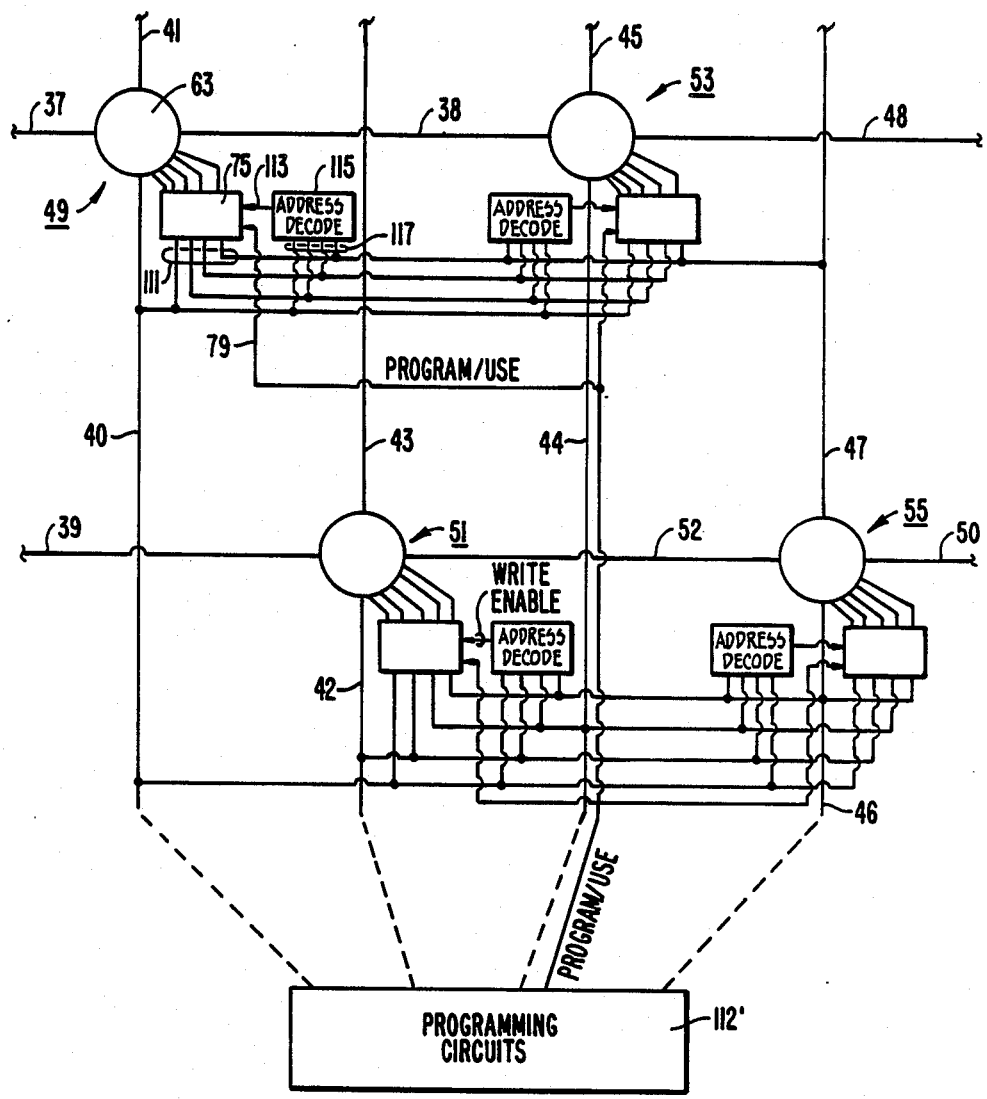
FIG._5.

INTEGRATED CIRCUIT PROGRAMMABLE CROSS-POINT CONNECTION TECHNIQUE

BACKGROUND OF THE INVENTION

This invention relates generally to the customizing of integrated circuit connections after fabrication of the circuit, and more specifically to circuits and methods that make such customization possible.

The development of a new complex integrated circuit requires a very large investment and takes a considerable amount of time. For that reason, systems designers who use the integrated circuits are limited in their choice of particular circuits available to them. Circuit suppliers have chosen not to design and produce a variety of forms of a particular circuit, in order to maintain a low price. It is extremely expensive to develop the new mask sets and other tooling required for manufacturing each circuit variation. As a result, systems designers who call for purchase of the circuits often have to utilize an integrated circuit that is less than ideal for a particular application. The designers often also have to combine with a particular integrated circuit additional standard circuits to overcome the disadvantage of the initial circuit for a particular application.

Therefore, it is a general object of the present invention to provide a technique and integrated circuit wherein the circuit can be programmed to conform to a number of specific circuit implementations that might be desired.

It is another object of the present invention to provide a technique for making integrated circuits more flexible to the user without unreasonably expanding the extent or complexity of circuits on the integrated circuit chip.

SUMMARY OF THE INVENTION

These and additional objects are accomplished by the present invention, wherein, briefly, extra circuits are provided as part of the integrated circuit which allow interconnections of a significant number of conductors to be made after the circuit chip has been manufactured and packaged. The interconnections can be programmed to meet a particular requirement by the user of the circuit after purchasing it, or can be made by the manufacturer or an intermediary after packaging. According to one specific aspect of the present invention, these connections are programmed by sending signals through the circuit pins and the very conductors that are adapted to be connected together in a predetermined manner at their cross-points. Each cross-point to be selectively connected includes a plurality of switching transistors whose state is programmed through the operable circuit conductors. Once the programming is complete, the conductors become connected in a manner to be used for the intended complete circuit. According to another specific aspect of the present invention, a particular configuration of five switching transistors is utilized to selectively connect four conductors together at a cross-point. Each of the four conductors terminates in a switching transistor. These transistors are connected together in pairs. The fifth transistor is connected between joined pairs of conductors.

Additional objects, advantages and features of the various aspects of the present invention will become apparent from the following description of its preferred embodiments, which description should be taken in conjunction with the accompanying drawings.

BRIEF DESCRIPTION OF THE DRAWINGS

FIG. 1 illustrates a portion of an integrated circuit utilizing the selective conductor connection techniques of the present invention;

FIG. 2 shows a preferred cross-point switch for use at the conductor cross-points of the circuit of FIG. 1;

FIG. 3 illustrates the various connections that may be programmed to be made by the cross-point switching circuit of FIG. 2; and FIGS. 4 and 5 illustrate particular alternative of the switching circuit of FIG. 2 in the integrated circuit of FIG. 1.

DESCRIPTION OF THE PREFERRED EMBODIMENTS

Referring initially to FIG. 1, an example of an integrated circuit is shown which advantageously uses the conductor inter-connection techniques of the present invention. As an example, pins 13, 15, 17 and 19 may terminate each of four conductors in a conductor group 21 on the chip. Similarly, individual pins 23, 25, 27 and 29 may terminate another conductor group 31 from the chip. It is desired to be able to program from outside the chip various connections to these sets of conductors of other conductors and circuit modules. For example, two circuit modules 33 and 35 are shown in FIG. 1 by way of example. Each module has conductors extending from the it for connection to both of the conductor sets 21 and 31. For example, the circuit module 33 includes conductors 37 and 39 for selective connection to conductors of the circuit group 31. A circle 49, for example, indicates a cross-point switch of the type discussed later with respect to FIG. 2. The switch 49 has the capability of connecting the circuit module conductor 37 with one or more of the conductor segments 38, 40 or 41 in accordance with one of a number of predetermined possibilities. Similarly, a cross-point switching circuit 51 is provided for selective connection of the conductors 39, 42, 43 and 52 to each other. Other cross-point switching circuits 53 and 55 are similarly provided for selective connection of other conductors.

Interconnection of the conductors 37 and 39 to others of the conductors of the set 31 where switches are not shown in FIG. 1 could be provided, but this example has been chosen to show that only potentially usable inter-connections need to be made possible. Another set of four conductors 57 also extend from the circuit module to the set of conductors 21 wherein any possible interconnection of the two sets of conductors 21 and 57 is possible by providing the sixteen cross-point switching circuits indicated. The circuit modules 33 and 35 may be blocks of logic or any other desired circuit configuration. Besides the circuit modules, another set of conductors 59 is provided for a selective connection to the conductors within the sets 21 and 31. Similarly, yet another set of conductors 61 is so provided. Of course, the particular layout of conductors, circuit modules and cross-point switching circuits will depend upon the particular circuit that is being designed and the number of variations that are being built into it.

Referring to FIG. 2, a single one of the cross-point switching circuits will be explained in detail. The elements within the dashed circle 63 provide a variety of possible inter-connections between four circuit conductors A, B, C and D. Each of these conductors terminates in a switching transistor. The conductor A terminates in transistor Q3, the conductor B in transistor Q1, the conductor C in transistor Q2, and the conductor D in transistor Q4. The transistors Q1 and Q3 are connected together, as shown, and the transistors Q2 and Q4 are connected together as part of the switch. The transistors of the switching circuit 63 are preferably of a field effect type. The voltage levels on conductors 65 and 67 are applied to gate elements of the transistors Q1 and Q3, respectively, and thus determine whether the transistors are in their conductive or non-conductive states. Similarly, the transistors Q2 and Q4 include respective gate leads 69 and 71. Another transistor Q5 is connected between the junctions of the two other pairs of transistors. A voltage level on a lead 73 is supplied to the gate of transistor Q5 and determines whether it is conductive or non-conductive, thereby determining whether the junctions between these transistor pairs Q1, Q3 and Q2, Q4 are connected directly together or not.

The particular arrangement of five switching transistors illustrated in the circuit 63 has great flexibility in types of connections that may be made between the conductors A, B, C, and D. These variations are illustrated in FIG. 3 wherein the state of each of the transistors Q1, Q2, Q3 and Q4 is given, except in the first entry for a reason explained below. A "0" indicates the particular transistor is in its non-conductive state, while a "1" indicates the transistor is in its conductive state. Each of the five transistors within the switching circuit 63 could be of a permanent programmable nature, such as including a fuse link, or using EPROM or EEROM technology. However, it is preferable to employ ordinary FET MOS transistors whose gates have a voltage applied from a circuit 75 that accompanies each of the switching circuits 63.

The circuit 63 has another advantage of being able to share its series conductor transistors with adjacent switching elements, thereby to reduce the number of transistors at each junction to something less than five. Further, a particular circuit application may require that only some of the possible connections illustrated in FIG. 3 are desirable or necessary for many of the cross-points, so only the transistors required to make the number of connections contemplated are utilized.

The switch controlling circuit 75 includes, in this particular embodiment, a four bit memory 77 which is programmed from outside the chip. The memory 77 controls the state of each of the transistors within the switching circuit 63. Although there are five transistors to be controlled, the circuit 75 requires only a four-bit memory 77. A circuit 75 also has a feature that a special program/use control signal applied to a line 79 selects between one state of the switch 63 that places it into its switched condition as designated by the contents of the memory 77 (the normal, operating condition), and another state, this other state being that shown in the first designation of FIG. 3 for the purpose of programming the switches, regardless of the contents of the memory 77. This temporary forcing of the switch to a predetermined default condition allows, as discussed hereinafter, the same conductors A, B, C, and D which are being connected together to be used to program the state of the memory 77.

Rather than connect each stage of the memory 77 directly to its associated gate of the switch 63 transistors, a plurality of inverter circuits 81, 83, 85, and 87 are provided. An output line 89 of one stage of the memory 77 has its signal level inverted by the inverter 81, the inverted signal being applied to the gate line 65 of transistor Q1. Similarly, a second stage output line 91 is inverted by circuit 83 to become the controlling voltage in line 69. Yet another memory output line 93, through inverter 85, is connected with gate line 67, and an output line 95 is connected through the inverter 87 whose output is the line 71 connected to the gate of transistor Q4.

Each of the memory output lines 89, 91, 93 and 95 is also connected to a gate of respective series transistors 97, 99, 101 and 103. These transistors are connected in series between ground potential and a node 104 and form a NAND gate. The gate control line 73 of transistor Q5 is also connected to the node 104. Line 73 is similarly connected to the source and gate of a load transistor 105 and to the gate of a transistor 107. The node 104 is maintained in a "1" state (high) when the circuit is in its normal use state, and thus transistor 107 keeps the inverters 81, 83, 85, and 87 connected to ground potential and transistor Q5 is normally conductive.

However, when the bits in the memory 77 are all "1", the node 104 is pulled low (to a "0" state) since each of the transistors 97, 99, 101 and 10 turned on. The transistor Q5 is then turned off, as a result. The inverting circuits 81, 83, 85, and 87 would normally, under this condition, apply a "0" state to each of the transistors Q1, Q2, Q3 and Q4 to maintain them in their off state but the fact that the node 104 has been pulled to a low voltage causes the transistor 107 to be turned off and the outputs of the inverter circuits applied to the gates of transistors Q1, Q2, Q3 and Q4 go high, thus turning on the transistors. The result is the switching configuration shown in the first line of FIG. 3. All other switching possibilities indicated in FIG. 3 maintain transistor Q5 in its conductive state. A fifth bit for the transistor Q5 need not be stored in the memory 77 to control its switching state under this system, thereby to keep it simple, but transistor Q5 could alternatively be separately controlled by adding a stage to the memory 77, if desired for some other reason.

The program/use signal line 79 is applied to the gate of another transistor 109 that is connected between the line 73 and ground potential. The signal is normally low (a "0") when the circuit is in its use mode. This causes the transistor 109 to be non-conductive (off). The state of the transistors of the circuit 63 will then conform to that set forth in FIG. 3, depending upon what is stored in the memory 77. When the voltage level on the signal line 79 goes high (to a "1"), on the other hand, the transistor 109 is turned on and the node 104 is brought to ground potential regardless of what is in the memory 77. The circuit is then in its program state. The switching transistors Q1, Q2, Q3 and Q4 are forced into their conductive states to give the conductor connection shown in the first entry of FIG. 3 so long as the program signal (a "1") remains on the line 79. The same things happen in the circuit in response to the program signal as explained in the preceeding paragraph when the memory 77 contains all "1's". The transistor 109, when turned on by the program signal, provides an alternate path for pulling the node 104 to ground potential. The circuit conductors A, B, C and D are thus able to carry programming signals to other cross-point switching circuits that may be connected to those conductors regardless of its programmed switch state.

The circuit of FIG. 2 is shown to be implemented in n-channel, depletion mode MOS technology. Of course, the same logical functions can be provided by the use of known alternative processing technologies.

The four bits of the memory 77 are programmed by application of the appropriate voltage levels to each of their individual input conductors, the four of them being indicated at 111. When the desired bits are impressed on those four lines, a signal in a line 113 causes them to be written into the memory 77. The memory 77 may be of any available type, such as EPROM, EEROM, volatile bi-stable memory, or may even be individual fuses that are somehow blown. The advantage of an EPROM, EEROM or volatile type memory is that it may be reprogrammed at a later time, if desired.

The memory 77 can be programmed by somehow extending each of the conductors 111 to outside the integrated circuit chip, but this is, of course, highly impractical since more of the chip would be utilized for the programming circuits than for the desired operating circuits. Therefore, it is preferable to utilize the interconnect lines to communicate the memory contents from outside the chip to the memories. Such a system is illustrated in FIG. 4 wherein the cross-points 49, 51, 53 and 55 of FIG. 1 are illustrated by way of example. Each of these cross-points has the same circuit, as illustrated in FIG. 2, so its application to the circuit of FIG. 4 is explained only with respect to cross-point 49, for brevity. Each of the memory input lines 111 is connected to a different one of the conductors 40, 43, 44 and 47. Programming circuits 112 are shown to be external to the chip, but connected thereto through conductor pins, then apply the contents designated for memory 77 at the cross-point 49. Alternatively, much of the programming circuit 112 may be placed on the chip itself.

The program/use signal is applied at the same time to each of the circuits so that the cross-points can be connected in their program state, as explained previously with respect to FIGS. 2 and 3. The conductors then carry from the programming circuits through each of the cross-points to the furthest cross-points, the contents to be recorded in their memories. When the content to be recorded in the memory 77 at the cross-point 49 is impressed on the pins 23, 25, 27 and 29, a write enable signal in its dedicated line 113 causes that pattern to be stored in its memory. Since none of the other cross-points receive a write enable signal, nothing occurs with them.

Another configuration is shown in FIG. 5 wherein the individual write enable lines are eliminated, thereby greatly reducing the number of conductors required for this purpose on the chip. In this embodiment, the write enable signal in the line 113 is generated by a logic circuit 115 that recognizes a unique address of that particular cross-point when the signals of that address are impressed across input conductors 117 to the decoding circuit. The programming circuits 112' of FIG. 5 must then remember the particular, unique address for each of the cross-points whose memories are to be programmed.

The embodiment of FIG. 5 provides for communicating those addresses over the conductor set 31 by time division multiplexing. That is, an address of a particular cross-point is put on those four conductors by the programming circuits 112'. The data to be stored in the memory of the circuit at that location is subsequently applied to the same four conductors. Standard techniques may be utilized to distinguish the address from the subsequent data transmission. Once one cross-point has been programmed, the address of another cross-point is impressed on those four conductors, followed by the data to be stored in its memory, and so forth.

Many variations of the FIG. 5 embodiment will become apparent. The address lines 117 to each of the decoding circuits for the cross-point programming may use another set of conductors, such as the set 21 of FIG. 1, to receive addresses and data simultaneously. The need for time division multiplexing is then eliminated. Further, a dedicated address bus could be connected to the address decoding circuits of each of the cross-point points. This is undesirable, however, because of the additional conductors necessary. A principal goal of any particular embodiment of the various aspects of the present invention is to reduce the amount of the integrated circuit chip that is required for use by programming elements, but yet being able to provide the desired flexibility in programming the cross-point connections. To state it another way, the goal is to use for the programming function as much of the circuit structure that initially exists as part of the basic operating circuit in order to make the circuit operate in its intended fashion. The dual use of the inter-connecting conductors significantly advances this purpose.

Although the various aspects of the present invention have been described with respect to their preferred embodiment, it will be understood that the invention is entitled to protection within the full scope of the appended claims.

It is claimed:

1. A switching circuit adapted for use in selectively controlling the electrical connection between at least first and second circuit conductors, comprising:
   first and second switching elements connected in the path of said first conductor,
   third and fourth switching elements connected in the path of said second conductor, and
   a fifth switching element connected between the first conductor, at a location between said first and second switching elements, and the second conductor, at a location between said third and fourth switching elements,
   each of said switching elements being characterized by having either a conductive or non-conductive state in response to a control signal, whereby the first and second circuit conductors can be connected together in a desired manner by an appropiate application of individual control signals to each of said first, second, third, fourth and fifth switching elements.

2. The switching circuit according to claim 1 wherein said switching circuit is embodied in an integrated circuit and each of said switching elements is a field effect transistor having a gate to receive its control signal.

3. The switching circuit according to claim 2 which additionally comprises a memory that is programmable from outside the integrated circuit for holding the individual control signals of the transistors in order to connect the first and second circuit conductors together in the desired manner.

* * * * *

(12) EX PARTE REEXAMINATION CERTIFICATE (5651st)
United States Patent
Freeman

(10) Number: US 4,670,749 C1
(45) Certificate Issued: Jan. 16, 2007

(54) INTEGRATED CIRCUIT PROGRAMMABLE CROSS-POINT CONNECTION TECHNIQUE

(75) Inventor: Ross H. Freeman, San Jose, CA (US)

(73) Assignee: State Street Bank and Trust Company, Hartford, CT (US)

Reexamination Request:
No. 90/006,871, Nov. 21, 2003

Reexamination Certificate for:
Patent No.: 4,670,749
Issued: Jun. 2, 1987
Appl. No.: 06/599,931
Filed: Apr. 13, 1984

(51) Int. Cl.
*H03K 19/177* (2006.01)

(52) U.S. Cl. .............................. 326/41; 326/37; 326/38; 326/47

(58) Field of Classification Search ............. 326/37–39, 326/41, 47
See application file for complete search history.

(56) References Cited

U.S. PATENT DOCUMENTS

| | | | |
|---|---|---|---|
| 3,201,574 A | 8/1965 | Szekely | 235/175 |
| 3,400,379 A | 9/1968 | Harman | 235/156 |
| 3,431,433 A | 3/1969 | Ball et al. | 307/221 |
| 3,439,185 A | 4/1969 | Gibson | 307/205 |
| 3,446,990 A | 5/1969 | Goldberg | 307/215 |
| 3,483,400 A | 12/1969 | Washizuka et al. | 307/279 |
| 3,564,514 A | 2/1971 | Gunderson | 340/172 |
| 3,576,984 A | 5/1971 | Gregg, Jr. | 235/176 |
| 3,619,583 A | 11/1971 | Arnold | 235/152 |
| 3,667,054 A | 5/1972 | Nelson | 328/111 |

(Continued)

FOREIGN PATENT DOCUMENTS

| | | |
|---|---|---|
| CA | 869681 | 4/1971 |
| DE | 3202498 | 8/1983 |
| EP | 0031431 | 7/1981 |
| EP | 0079127 | 5/1983 |
| EP | 0094234 | 11/1983 |
| FR | 2.160.969 | 7/1973 |
| GB | 1059213 | 2/1967 |
| GB | 1090520 | 11/1967 |
| GB | 1101851 | 1/1968 |
| GB | 1516817 | 7/1978 |

(Continued)

OTHER PUBLICATIONS

PAL Programmable Array Logic Handbook, Third Edition, 1978, 1981, 1983, pp. 1 through 1–16.
Introduction to VLSI Systems Carver Mead, Lynn Conway, 2nd Printing, Oct. 1980, pp. 157 through 159.
PAL Programmable Array Logic Handbook, Monolithic Memories, 1978, pp. 1–2 through 2–5.
PAL Programmable Array Logic Handbook, Monolithic Memories, 1981, pp. 1 through 1–16.
Complaint: Demand for Jury Trial; Certification of Interested Entities of Persons—*ZiLOG* v. *QuickLogic*—USDC ND Cal. C 03–3725 BZ.

(Continued)

*Primary Examiner*—Anh Q. Tran

(57) ABSTRACT

A technique for programming connections of conductors that is particularly adapted to be implemented as part of an integrated circuit so that a number of connections internal of the circuit can be made from outside the circuit in order to customize it after fabrication. A specific arrangement of five switching transistors is particularly advantageous for each cross-point of two conductors to be connected together in one of many possible ways. The desired switching arrangement at each cross-point may be programmed by use of the same conductors being interconnected to carry control signals from outside the circuit to a memory associated with each cross-point switching circuit. While these memories are being programmed, each cross-point is temporarily forced to a desired state for communicating the control signals from outside the circuit to the memories.

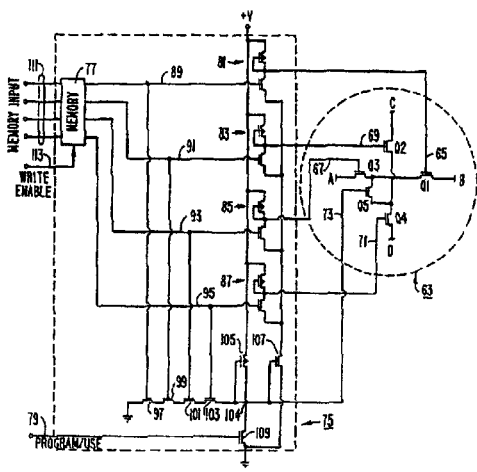

U.S. PATENT DOCUMENTS

| Patent | Date | Inventor | Class |
|---|---|---|---|
| 3,691,401 A | 9/1972 | Forlani et al. | 307/215 |
| 3,702,985 A | 11/1972 | Proebsting | 340/166 |
| 3,743,948 A | 7/1973 | Dahlin et al. | 328/119 |
| 3,750,115 A | 7/1973 | Mundy | 340/173 |
| 3,816,725 A | 6/1974 | Greer | 235/152 |
| 3,818,252 A | 6/1974 | Chiba et al. | 307/303 |
| 3,818,452 A | 6/1974 | Greer | 340/166 |
| 3,838,296 A | 9/1974 | McLeod | 307/243 |
| 3,849,638 A | 11/1974 | Greer | 235/152 |
| 3,852,723 A | 12/1974 | Wu | |
| 3,936,812 A | 2/1976 | Cox et al. | 340/173 |
| 3,967,251 A | 6/1976 | Levine | 340/172.5 |
| 3,983,543 A | 9/1976 | Cordaro | 340/173 |
| 3,987,287 A | 10/1976 | Cox et al. | 235/152 |
| 3,990,045 A | 11/1976 | Beausoleil et al. | 340/146.3 |
| 4,020,469 A | 4/1977 | Manning | 340/172.5 |
| 4,024,352 A | 5/1977 | Mukaemachi et al. | |
| 4,032,894 A | 6/1977 | Williams | 340/166 |
| 4,068,214 A | 1/1978 | Patil | 340/166 |
| 4,068,215 A | 1/1978 | Mukaemachi et al. | |
| 4,084,152 A | 4/1978 | Long et al. | 340/166 |
| 4,091,359 A | 5/1978 | Rossler | 340/166 |
| 4,103,182 A | 7/1978 | Bradley | 307/203 |
| 4,107,549 A | 8/1978 | Moufah | 307/205 |
| 4,120,043 A | 10/1978 | Su | 364/900 |
| 4,123,669 A | 10/1978 | Devine et al. | 307/205 |
| 4,124,899 A | 11/1978 | Birkner et al. | 364/716 |
| 4,125,869 A | 11/1978 | Gutmann | 364/900 |
| 4,154,978 A | 5/1979 | Tu | 178/71 |
| 4,157,480 A | 6/1979 | Edwards | 307/203 |
| 4,157,589 A | 6/1979 | Kapral et al. | 364/716 |
| 4,161,662 A | 7/1979 | Malcolm et al. | 307/213 |
| 4,177,452 A | 12/1979 | Balasubramanian et al. | 340/166 |
| 4,195,352 A | 3/1980 | Tu et al. | 364/900 |
| 4,207,556 A | 6/1980 | Sugiyama et al. | |
| 4,208,728 A | 6/1980 | Blahut et al. | 365/154 |
| 4,233,667 A | 11/1980 | Devine et al. | 364/900 |
| 4,237,542 A | 12/1980 | Cukier | 364/900 |
| 4,240,094 A | 12/1980 | Mader | 357/45 |
| 4,244,032 A | 1/1981 | Oliver | 364/900 |
| 4,245,324 A | 1/1981 | Machol et al. | 364/716 |
| 4,249,246 A | 2/1981 | Nanya et al. | 364/716 |
| 4,259,366 A | 3/1981 | Balasubramanian et al. | 427/88 |
| 4,268,908 A | 5/1981 | Logue et al. | 364/200 |
| 4,281,398 A | 7/1981 | McKenny et al. | 365/200 |
| 4,284,953 A | 8/1981 | Hepworth et al. | 328/37 |
| 4,290,121 A | 9/1981 | Boone et al. | 365/233 |
| 4,292,548 A | 9/1981 | Suarez et al. | 307/465 |
| 4,293,783 A | 10/1981 | Patil | 307/465 |
| 4,295,064 A | 10/1981 | Schuster | 307/468 |
| 4,307,379 A | 12/1981 | Wyland | 340/825 |
| 4,331,893 A | 5/1982 | Conners | 307/465 |
| 4,331,956 A | 5/1982 | Anderson et al. | |
| 4,336,601 A | 6/1982 | Tanaka | 364/900 |
| 4,348,736 A | 9/1982 | Weinberger | 364/787 |
| 4,348,737 A | 9/1982 | Cukier et al. | 364/900 |
| 4,357,678 A | 11/1982 | Davis | 364/900 |
| 4,366,393 A | 12/1982 | Kasuya | 307/221 |
| 4,380,811 A | 4/1983 | Goetze et al. | 371/10 |
| 4,390,970 A | 6/1983 | Kay | 365/73 |
| 4,392,198 A | 7/1983 | Shimazaki | 364/200 |
| 4,395,646 A | 7/1983 | Cases et al. | 307/468 |
| 4,399,516 A | 8/1983 | Blahut et al. | 364/716 |
| 4,409,499 A | 10/1983 | Zapisek et al. | 307/468 |
| 4,409,680 A | 10/1983 | Schnathorst et al. | 365/233 |
| 4,414,547 A | 11/1983 | Knapp et al. | 340/825.83 |
| 4,415,818 A | 11/1983 | Ogawa et al. | 307/465 |
| 4,415,973 A | 11/1983 | Evans | 364/200 |
| 4,422,072 A | 12/1983 | Cavlan | 340/825.87 |
| 4,431,928 A | 2/1984 | Skokan | 307/465 |
| 4,433,331 A | 2/1984 | Kollaritsch | 340/825.83 |
| 4,435,805 A | 3/1984 | Hsieh et al. | 371/25 |
| 4,442,507 A | 4/1984 | Roesner | 365/100 |
| 4,446,382 A | 5/1984 | Moore et al. | 307/241 |
| 4,453,096 A | 6/1984 | Le Can et al. | 307/448 |
| 4,458,163 A | 7/1984 | Wheeler et al. | 307/466 |
| 4,458,297 A | 7/1984 | Stopper et al. | |
| 4,467,439 A | 8/1984 | Rhodes | 364/716 |
| 4,495,629 A | 1/1985 | Zasio et al. | 377/70 |
| 4,499,557 A | 2/1985 | Holmberg et al. | 365/163 |
| 4,508,977 A | 4/1985 | Page et al. | 307/468 |
| 4,513,307 A | 4/1985 | Brown | 357/42 |
| 4,519,050 A | 5/1985 | Folmsbee | 365/53 |
| 4,527,115 A | 7/1985 | Mehrotra et al. | 324/73 |
| 4,541,067 A | 9/1985 | Whitaker | 364/716 |
| 4,541,114 A | 9/1985 | Rutenbar et al. | 382/8 |
| 4,545,111 A | 10/1985 | Johnson | 29/574 |
| 4,551,814 A | 11/1985 | Moore et al. | 364/716 |
| 4,551,815 A | 11/1985 | Moore et al. | 364/716 |
| 4,558,236 A | 12/1985 | Burrows | 307/465 |
| 4,564,773 A | 1/1986 | Tanizawa et al. | 307/445 |
| 4,575,794 A | 3/1986 | Veneski et al. | 364/200 |
| 4,599,705 A | 7/1986 | Holmberg et al. | 365/163 |
| 4,600,846 A | 7/1986 | Burrows | 307/465 |
| 4,622,648 A | 11/1986 | Whitaker | 364/715 |
| 4,642,487 A | 2/1987 | Carter | 307/465 |
| 4,695,740 A | 9/1987 | Carter | 307/242 |
| 4,700,187 A | 10/1987 | Furtek | 340/825.83 |
| 4,706,217 A | 11/1987 | Shimizu et al. | 365/154 |
| 4,717,912 A | 1/1988 | Harvey et al. | 340/825.83 |
| 4,727,268 A | 2/1988 | Hori | 307/465 |
| 4,742,252 A | 5/1988 | Agrawal | 307/465 |
| 4,742,383 A | 5/1988 | Fitzgerald | 357/45 |
| 4,758,745 A | 7/1988 | Elgamal et al. | 307/465 |
| 4,774,421 A | 9/1988 | Hartmann et al. | 307/465 |

FOREIGN PATENT DOCUMENTS

| Country | Number | Date |
|---|---|---|
| GB | 2045488 | 10/1980 |
| GB | 2121573 | 12/1983 |
| GB | 2138188 | 10/1984 |
| GB | 2171231 | 8/1986 |
| JP | 53-137616 | 12/1978 |
| JP | 55-141836 | 11/1980 |
| JP | 56-91534 | 7/1981 |
| JP | 57-111044 | 7/1982 |
| JP | 58-57825 | 4/1983 |
| JP | 58-191535 | 11/1983 |
| JP | 59-161839 | 9/1984 |
| JP | 60-68722 | 4/1985 |

OTHER PUBLICATIONS

Horrell, J.L. "A Programmable Switching System in an Asynchronous Digital Node".

Interface Integrated Circuits: National Data Book, Apr. 1984, pp. 8–10 and 8–31.

MM54HC/74HC High Speed microCMOS Logic Family Data Book, 1983, pp. 4–387 (Cover Sheet).

Askin, et al., "PLA With Segmented Lines For Faster Signal Processing," IBM Technical Disclosure Bulletin, vol. 24, No. 7B, Dec. 1981, p. 3898.

J. Sklansky, Conditional–Sum Addition Logic; IEEE Transactions on Electronic Computers; 1959.

R. C. Minnick; Cutpoint Cellular Logic, IEEE Transactions on Electronic Computers, Dec. 1964, pp. 685–698.

Gamblin et al., "Thin Film Universal Logic Block", IBM T.D.B., vol. 9, No. 6, Nov. 1966, pp. 662–664.

W. H. Kautz; A Cellular Threshold Array; IEEE Transactions on Electronic Computers Oct. 1967, pp. 680–682.

A. Weinberger; Large Scale Integration of MOS Complex Logic: A Layout Method, IEEE Journal of Solid–state Circuits, vol. SC–2, Dec. 1967; pp. 182–190.

W. H. Kautz, K. N. Levitt, A. Waksman, Cellular Interconnection Arrays, IEEE Transactions On Computers, vol. C–17, No. 5, pp. 443–451, May 1968.

W. H. Kautz, Cellular Logic–in–Memory Arrays, IEEE Transactions on Computers, vol. C–18, No. 8, pp. 719–727, Aug. 1969.

S. Yau and C. Tang, Universal Logic Modules and Their Applications, IEEE Transactions on Computers, vol. c–19, No. 2, Feb. 1970, pp. 141–149.

Millman, J. and Halkias, C., Integrated Electronics: Analog and Digital Circuits and Systems, McGraw–Hill Book Company, New York, 1972, pp. 58–59.

Machart et al., "General Function Circuit", IBM T.D.B., vol. 15, No. 1, Jun. 1972, p. 11.

S. B. Akers, Jr.; A Rectangular Logic Array, IEEE Transactions On Computers, vol. C–21, No. 8, pp. 848–857, Aug. 1972.

J. R. Jump, D. R. Fritsche; Microprogrammed Arrays, IEEE Transactions On Computers, vol. C–21, No. 9, pp. 974–984, Sep. 1972. (2 missing pages).

D. Greer, An Associative Logic Matrix, IEEE Journal of Solid–State Circuits, vol. SC–11, No. 5, pp. 679–691, Oct. 1976.

S. Murugesan; Programmable Universal Logic Module; Int. Journal Electronics, vol. 40, No. 5 pp. 509–512, 1976.

R. C. Aubusson, I. Catt; Wafer–Scale Integration—A Fault–Tolerant Procedure, IEEE Journal of Solid–State Circuits, vol. SC–13 No. 3, pp. 339–344, Jun. 1978.

R. D. Harrod and H. R. Moore, "Ungated Common I/O Buffer for Card Testing", IBM T.D.B., vol. 21, No. 6, Nov. 1978, 2 pages.

J. I Raffel, MIT Lincoln Laboratory, "On the Use of Non-volatile Programmable Links for Restructurable VLSI", Proceedings of the Caltech Conference on VLSI, California Institute of Technology, Jan. 1979, 10 pages.

A. H. Anderson; Restructurable VLSI Program of MIT Lincoln Laboratories; Semiannual Technical Summary Report to the Defense Advanced Research Projects Agency, Apr. 1, 1979—Mar. 31, 1980, 32 pages (3 missing pages).

R. A. Wood; A High Density Programmable Logic Array Chip; IEEE Transaction on Computers vol. C–28 No. 9, pp. 602–608, Sep. 1979.

S. S. Patil and T. A. Welch, A Programmable Logic Approach for VLSI, IEEE Journal of Solid–State Circuits, vol. C–28, No. 9, pp. 594–601, Sep. 1979.

Raffel, J., et al., "Laser Programmed Vias for Restructurable VLSI", Massachussets Institute of Technology, Lincoln Laboratory, International Electron Devices Meeting, 1980, pp. 132–135.

H. Fujiwara, K. Kinoshita, H. Ozaki; Universal Test Sets for Programmable Logic Arrays, International Symposium on Fault–tolerant Computing, IEEE, pp. 137–142, 1980.

S. J. Hong, D. L. Ostapko; FITPLA: A Programmable Logic Array for Function Independent Testing, IEEE 1980, pp. 131–136.

M. Tanimoto, J. Murota, Y. Ohmori, N. Ieda; Novel MOS PROM Using a Highly Resistive Poly–Si Resistor, IEEE Transactions On Electron Devices, vol. ED–27, No. 3, pp. 517–520, Mar. 1980.

P. Blankenship; Restructurable VLSI Program of MIT Lincoln Laboratories; Semiannual Technical Summary Report to the Defense Advanced Research Projects Agency, Apr. 1, 1980—Mar. 31, 1981, 59 pages. (4 missing pages).

A. D. Lopez, H. S. Law; A Dense Gate Matrix Layout Method for MOS VLSI, IEEE Journal of Solid–State Circuits, vol. SC–15, No. 4, pp. 736–740, Aug. 1980.

L. Snyder; Introduction to the Configurable, Highly Parallel Computer, Nov. 1980, Revised May 1981, 32 pages.

X. Chen, S. L. Hurst; A Consideration of the Minimum Number of Input Terminals on Universal Logic Gates and Their Realization; Int. Journal Electronics, vol. 50, No. 1, 1–13; 1981, 13 pages.

P. Blankenship; Restructurable VLSI Program of MIT Lincoln Laboratories; Semiannual Technical Summary Report to the Defense Advanced Research Projects Agency, Apr. 1,–Sep. 30, 1981, 42 pages. (4 missing pages).

Wood, R. A., Hsieh, Yu–Nian, Price, C. A., and Wang, P. P., "An Electrically Alterable PLA for Fast Turnaround–Time VLSI Development Hardware", IEEE Journal of Solid–State Circuits, vol. SC–16, No. 5, pp. 570–577, Oct. 1981.

P. Blankenship; Restructurable VLSI Program, Semiannual Technical Summary Report to the Defense Advanced Research Projects Agency, Oct. 1, 1981–Mar. 31, 1982, 67 pages. (4 missing pages).

Raffel, J., et al., "A Demonstration of Very Large Area Integration Using Restructurable Laser Links", Massachussetts Institute of Technology, Lincoln Laboratory, IEEE ISSC 1982, 9 pages.

L. Snyder; The Configurable, Highly Parallel (CHiP) Approach for Signal Processing Applications, Proceedings of the Technical Symposium East Society of Photo–Optical Instrumentation Engineers, 1982, 10 pages. (even pages missing 2–16).

Lawrence Snyder, Purdue University, "Introduction to the Configurable, Highly Parallel Computer", IEEE, Computer, vol. 15, No. 1, Jan. 1982, pp. 47–56.

X. Chen and S. L. Hurst, "A Comparison of Universal–Logic–Module Realizations and Their Application in the Synthesis of Combinatorial and Sequantial Logic Networks", IEEE Transactions on Computers, C–31 No. 2, pp. 140–147, Feb. 1982.

P. Blankenship; Restructurable VLSI Program of MIT Lincoln Laboratories; Semiannual Technical Summary Report to the Defense Advanced Research Projects Agency, Apr. 1–Sep. 30, 1982, 55 pages. (12 missing pages).

A. H. Anderson, Restructurable VLSI, Redundancy Workshop, IEEE Journal of Solid–State Circuits and Technology Committee, May 5, 1982, 17 pages.

J. P. Hayes; A Unified Switching Theory with Applications to VLSI Design, Proceedings of the IEEE, vol. 70, No. 10, pp. 1140–1151, Oct. 1982.

K. Hedlund, "Wafer Scale Integration of Configurable, Highly Parallel Processors," Ph.D. Thesis under Prof. L. Snyder, Purdue University, Dec. 1982, 259 pages.

L. Snyder, "The Role of the CHiP Computer in Signal Processing," Chapter 9, pp. 170–177, (1983 or later).

M. Sami, R. Stefanelli; Reconfigurable Architectures for VLSI Processing Arrays, National Computer Conference, 1983, pp. 565–577.

J. I. Raffel; Restructurable VLSI Using Laser Cutting & Linking, SPIE/LA'83, Jan. 17–21, 1983, 16 pages.

A.C. Adams, "Plasma Deposition of Inorganic Films", Solid State Technology, Apr. 1983, pp. 135–139.

J. I. Raffel, J. F. Freidin, G. H. Chapman; Laser–Formed Connections Using Polyimide; Applied Physics Letters, vol. 42, No. 8, pp. 705–706, Apr. 15, 1983.

S. L. Garverick, E. A. Pierce; A Single Wafer 16–Point 16–MHZ FFT Processor; IEEE Proceedings of the Custom Integrated Circuits Conference, pp. 244–248, May 1983.

J. I. Raffel, A. H. Anderson, G. H. Chapman, S. L. Garverick, K. H. Konkle, B. Mathur, A. M. Soares; A Demonstration of Very Large Area Integration Using Laser Restructuring; International Symposium on Circuits and Systems, pp. 781–784, May 2–4, 1983 (vol. 2 of 3).

S. L. Garverick, E. A. Pierce; Assignment and Linking Software For Restructurable VLSI; IEEE 1983 Custom Integrated Circuits Conference; May 23–25, 1983 2 pages.

Iversen, W., "Amorphous vias in wafer link chips", Electronics, vol. 56, No. 19, Sep. 22, 1983, pp. 48–49.

G. Gentile, M. G. Sami M. Terzoli, Design of Switches for Self–Reconfiguring VLSI Array Structures; Microprocessing and Microprogramming, 14; pp. 99–105, 1984.

A. Srivastava, S. Gupta C. Shekhar, Computer–Aided Design of an Eight Bit Binary Counter N–MOS Chip for Large Scale Integration (LSI), Microelectronics and Reliability; Pergamon Press, vol. 24, No. 5, pp. 885–896, 1984.

K. S. Hedlund, L. Snyder; Systolic Architectures—A Wafer Scale Approach, pp. 604–610, IEEE 1984.

Iversen, W., "Amorphous switches add PROM density", Electronics, vol. 57, No. 7, Apr. 5, 1984, p. 54.

G. H. Chapman, A. H. Anderson, K. H. Konkle, B. Mathur, J. I. Raffel, A. M. Soares; Interconnection and Testing of a Wafer–Scale Circuit with Laser Processing; Digest of Technical Papers of the Conference on Lasers and Electro–Optics, Jun. 19–22, 1984, 3 pages.

Raffel, J., et al., "A Wafer–Scale Digital Integrator", IEEE International Conference on Computer Designs VLSI in Computers, Oct. 1984, pp. 121–126.

Wyatt, P., et al., "Process Considerations in Restructurable VLSI for Wafer–Scale Integration", Massachusetts Institute of Technology, Lincoln Laboratory, International Electron Devices Meeting, Dec. 1984, pp. 626–629.

Bogdan, Albert, "An Electrically Programmable Silicon Circuit Board", Mosaic Systems, Inc. pp. 472–476. (in file wrapper of 5,717,230).

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 2 and 3 is confirmed.

* * * * *

(12) EX PARTE REEXAMINATION CERTIFICATE (7397th)
United States Patent
Freeman

(10) Number: US 4,670,749 C2
(45) Certificate Issued: Mar. 2, 2010

(54) INTEGRATED CIRCUIT PROGRAMMABLE CROSS-POINT CONNECTION TECHNIQUE

(75) Inventor: Ross H. Freeman, San Jose, CA (US)

(73) Assignee: State Street Bank and Trust Company, Hartford, CT (US)

Reexamination Request:
No. 90/008,163, Aug. 14, 2006
No. 90/010,118, Mar. 7, 2008

Reexamination Certificate for:
Patent No.: 4,670,749
Issued: Jun. 2, 1987
Appl. No.: 06/599,931
Filed: Apr. 13, 1984

Reexamination Certificate C1 4,670,749 issued Jan. 16, 2007

(51) Int. Cl.
*H04Q 1/00* (2006.01)

(52) U.S. Cl. ............ 326/41; 257/E21.591; 257/E27.105; 326/38; 326/39

(58) Field of Classification Search ........................ None
See application file for complete search history.

(56) References Cited

U.S. PATENT DOCUMENTS

| | | | |
|---|---|---|---|
| 3,963,872 A | 6/1976 | Hagstrom et al. | |
| 4,173,791 A | 11/1979 | Bell | |
| 4,207,556 A | 6/1980 | Sugiyama et al. | |

FOREIGN PATENT DOCUMENTS

| | | |
|---|---|---|
| JP | 55-95156 | 7/1980 |
| JP | 58-207654 | 12/1983 |
| JP | S58-207654 | 12/1983 |
| JP | 59-5647 | 1/1984 |
| JP | S59-5647 | 1/1984 |

OTHER PUBLICATIONS

Yacoub M. El–Ziq, Computer–Aided Logic Design of Two–Level MOS Combinational Networks with Statistical Results, IEEE Transactions on Computers, vol. C–27, No. 10, Oct. 1978.
Carver and Mead and Lynn Conway, Introduction to VLSI Systems, Addison–Wesley Publishing Company 1980.
T. Kilburn, et al., A Parallel Arithmetic Unit Using A Saturated–Transistor Fast–Carry Circuit, Nov. 1960, pp. 573–584, The Institution of Electrical Engineers.
Ching–Chih Hsiao, Highly Parallel Processing of Relational Databases, Dec. 1982, pp. 1–120, Purdue University, West Lafayette, IN.
C. Mead, L. Conway, Introduction to VLSI Systems, Oct. 1980, pp. 60–90, 145–188 and 263–329, Addison–Wesley Publishing Company, Philippines.
L. Snyder, Overview of The CHiP Computer, Aug. 19, 1981, pp. 236–246, Academic Press Inc., New York, NY.
L. Snyder, Introduction to the Poker Parallel Programming Environment, Proceedings of the 1983 International Conference on Parallel Processing, Aug. 1983, pp. 289–292, IEEE Computer Society Press, Silver Spring, MD.

(Continued)

*Primary Examiner*—Minh T Nguyen

(57) ABSTRACT

A technique for programming connections of conductors that is particularly adapted to be implemented as part of an integrated circuit so that a number of connections internal of the circuit can be made from outside the circuit in order to customize it after fabrication. A specific arrangement of five switching transistors is particularly advantageous for each cross-point of two conductors to be connected together in one of many possible ways. The desired switching arrangement at each cross-point may be programmed by use of the same conductors being interconnected to carry control signals from outside the circuit to a memory associated with each cross-point switching circuit. While these memories are being programmed, each cross-point is temporarily forced to a desired state for communicating the control signals from outside the circuit to the memories.

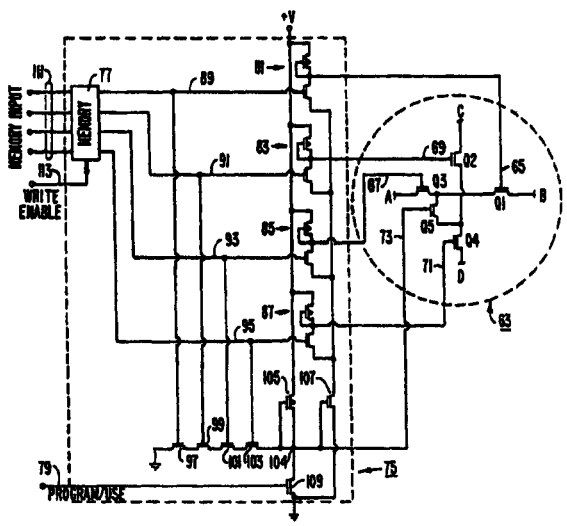

OTHER PUBLICATIONS

K. Hedlund, et al., Wafer Scale Integration of Configurable, Highly Parallel (CHiP) Processors—Extended Abstract–, Proceedings of the 1982 International Conference on Parallel Processing, Aug. 1982, pp. 262–264, IEEE Computer Society Press, Silver Spring, MD.

D. Gannon et al., Linear Recurrence Systems For VLSI: The Configurable, Highly Parallel Approach, Proceedings of the 1981 International Conference on Parallel Processing, Aug. 1981, pp. 259–260, IEEE Computer Society Press, Silver Spring, MD.

J. T. Field, A.Kapauan, L. Snyder, Pringle: A Parallel to Emulate CHiP Computers, Jan. 1983, pp. 1–15, NTIS, Springfield, VA.

H. Siegel, A Model of SIMD Machines and a Comparison of Various Interconnection Networks, IEEE Transactions on Computers, Dec. 1979, pp. 907–917, vol. c–28, No. 12.

L. Snyder, The Configurable, Highly Parallel (CHiP) Approach for Signal Processing Applications, Proceedings of the Technical Symposium East, Society of Photo–Optical Instrumentation Engineers, 1982, pp. 1–17.

L. Snyder, Introduction to the Configurable, Highly Parallel Computer, Nov. 1980, revised May 1981, pp. 1–31, Dept. of Computer Sciences, Purdue University, W. Lafayette, IN.

H. T. Kung, C. E. Leiserson, Systolic Arrays (For VLSI), Sparse Matrix Proceedings 1978, 1978, pp. 256–282, Society for Industrial and Applied Mathematics.

L. Snyder, Programming Processor Interconnection Structures, Oct. 1981, pp. 1–25, Dept. of Computer Sciences, Purdue University, West Lafayette, IN.

G. Barnes, et al., The Illiac IV Computer, IEEE Transactions on Computers, Aug. 1968, pp. 746–757, vol. c–17, No. 8.

B. Randell, P.C. Treleaven, VLSI Architecture, 1983, pp. 23–33, Prentice Hall International, Inc., United States of America.

M. Townsend, et al., An NMOS Microprocessor for Analog Signal Processing, IEEE Journal of Solid–State Circuits, Feb. 1980, pp. 33–38, vol. SC–15, No. 1.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–3 are cancelled.

\* \* \* \* \*